United States Patent [19]

Dekker

[11] Patent Number: 5,585,762
[45] Date of Patent: Dec. 17, 1996

[54] ARRANGEMENT FOR CONTROLLING THE OPERATION OF A HIGH-FREQUENCY POWER AMPLIFIER

[75] Inventor: André P. Dekker, Oulu, Finland

[73] Assignee: Nokia Telecommunications Oy, Espoo, Finland

[21] Appl. No.: 448,353

[22] PCT Filed: Sep. 5, 1994

[86] PCT No.: PCT/FI94/00393

§ 371 Date: May 2, 1995

§ 102(e) Date: May 2, 1995

[87] PCT Pub. No.: WO95/07573

PCT Pub. Date: Mar. 16, 1995

[30] Foreign Application Priority Data

Jun. 9, 1993 [FI] Finland .................................. 933886

[51] Int. Cl.$^6$ ..................................................... H03G 3/20
[52] U.S. Cl. ............................ 330/144; 330/284; 455/126
[58] Field of Search ............................. 330/85, 129, 144, 330/279, 284; 455/126

[56] References Cited

U.S. PATENT DOCUMENTS 4,563,775  1/1986  Yokosuka .............................. 455/126
4,709,403 11/1987  Kikuchi .................................. 455/126
5,214,393  5/1993  Aihara .................................... 330/279
5,381,115  1/1995  Timmons et al. ..................... 330/279
5,438,683  8/1995  Durtler et al. ..................... 330/284 X

FOREIGN PATENT DOCUMENTS 0135154  11/1987  European Pat. Off. .

*Primary Examiner*—Steven Mottola
*Attorney, Agent, or Firm*—Cushman Darby & Cushman IP Group of Pillsbury Madison & Sutro LLP

[57] ABSTRACT

An arrangement for controlling the operation of a high-frequency power amplifier includes a high-frequency power amplifier connected to a forward line and a control, and an attenuator connected to the input side thereof. A sampler and a detector are connected to a feedback line between the output side and the input side of the high-frequency power amplifier. An amplifier is connected to the feedback line on the input side of the detector, the gain of the latter amplifier being of the same order of magnitude as the attenuation provided by the attenuator.

10 Claims, 1 Drawing Sheet

ARRANGEMENT FOR CONTROLLING THE OPERATION OF A HIGH-FREQUENCY POWER AMPLIFIER

BACKGROUND OF THE INVENTION

The invention relates to a method and an arrangement for controlling the operation of a high-frequency power amplifier.

In GSM transmitters, for instance, specifications place rigid restrictions also on the operation of the transmitter as well as on switching on or off the transmission power. When the transmission power is switched off at a GSM transmission, it should be possible to reduce the transmission power during idle time slots between frames by at least 70 dB, in practice by 80 dB, which can be realized by decreased gain and by using RF switching means providing an attenuation of about 40 dB, in addition to the 40 dB obtained by the control of the amplifier. One problem with the previous solutions is that the dynamic range of detector means is only about 40 dB.

In some methods and arrangements according to the prior art, the transmission power is switched off by using a switching means positioned in a power control loop on the input side of an amplifier, whereby the signal path breaks, however, and the detector output remains floating in a way. This generates a control signal undefined in its details in a control means of the input side of the amplifier, which in turn causes problems, i.e. practically a control error in a situation when the transmission power shall be switched on again. A control error may also cause a decrease in attenuation when the power is switched off. This restricts the permitted maximum gain between the detector and the control means as well, which maximum gain determines in turn the accuracy of the output power in an ON state.

In another known embodiment, a switching means is positioned in an antenna line outside a power control loop, which requires, however, an amplifier and an RF switch with a higher power, which leads to bigger power losses.

It is also known from the prior art to use a logarithmic RF range amplifier and detector to expand the dynamic range of the detector, but the component in question is an expensive hybrid component and thus not necessarily a suitable choice always.

From European Patent Application 0 135 154 is known an apparatus for controlling transmission power, but no reference is made therein to bringing an amplifier to an OFF state. The objective of the apparatus disclosed in that publication is to minimize variations in loop gain caused by the non-linearity of the power amplifier. The EP publication relates to controlling DC gain and by no means to controlling RF gain or RF attenuation, which is the case in the present invention. In the solution disclosed in the EP publication, the control of a power control loop comes from inside the loop.

THE INVENTION

The object of the present invention is to set forth a novel method and arrangement for controlling the operation of a high-frequency power amplifier, which avoid the problems associated with the known solutions.

This object is achieved by means of the method according to the invention, which is characterized in that the high-frequency power amplifier is brought to the OFF state without breaking the signal path by attenuating the signal to be inputted to the input side of the high-frequency power amplifier by a desired attenuation and by amplifying the signal of the feedback line by a desired gain. The arrangement according to the invention is characterized in that an amplifying means is connected to the feedback line on the input side of the detector, the gain of which means is of the same order of magnitude as the attenuation of the attenuation means.

The method and arrangement according to the invention are based on the idea that both attenuation and gain are supplied to the power control loop without breaking the signal path, due to which the detector means does not react to switching off the transmission power in a detrimental manner, which caused control error in the previous solutions.

Several advantages are achieved by means of the solution according to the invention especially therein that the power control loop does not break, not even when the power is switched off, due to which a narrower frequency spectrum and a faster reaction to reswitching the gain are provided. In the solution of the invention, the properties of the high-frequency power amplifier are better than in the known solutions, both during gain and when the power is switched on or off. The new solution provides a smaller power loss than a solution the switching means of which is in an antenna line. The new solution also provides a more accurate output power than a solution the switching means of which is on the input side of the power amplifier.

The method comprises inputting a signal to be amplified to a high-frequency power amplifier in a forward line, generating a sample signal from the forward line on the output side of the high-frequency power amplifier to a feedback line, controlling the high-frequency power amplifier via the feedback line on the basis of the sample signal by a control means connected to the input side of the high-frequency power amplifier and bringing the high-frequency power amplifier to an OFF state controlled by a control signal.

The arrangement according to the invention comprises a high-frequency power amplifier connected to a forward line, a control means and an attenuation means connected to the input side of the high-frequency power amplifier and a sampling means and a detector means connected to a feedback line between the output side and input side of the high-frequency power amplifier. The forward line and the feedback line form a kind of a power control loop, by means of which the power of a transmitter is connectable to an antenna.

The present solution relates especially to multichannel radio transmitters and how to switch on the transmission power of a high-frequency power amplifier of a radio transmitter and particularly how to switch off the transmission power, i.e., how to bring it to an OFF state. One example of radio transmitters is a base station radio transmitter of a GSM mobile telephone network utilizing a TDMA system, the high-frequency power amplifier of which transmitter amplifies the signals to be received from a modulator before these are inputted to an antenna.

BRIEF DESCRIPTION OF THE DRAWING

In the following, the invention will be described in more detail referring to the attached drawings, in which.

DETAILED DESCRIPTION

Figure 1:
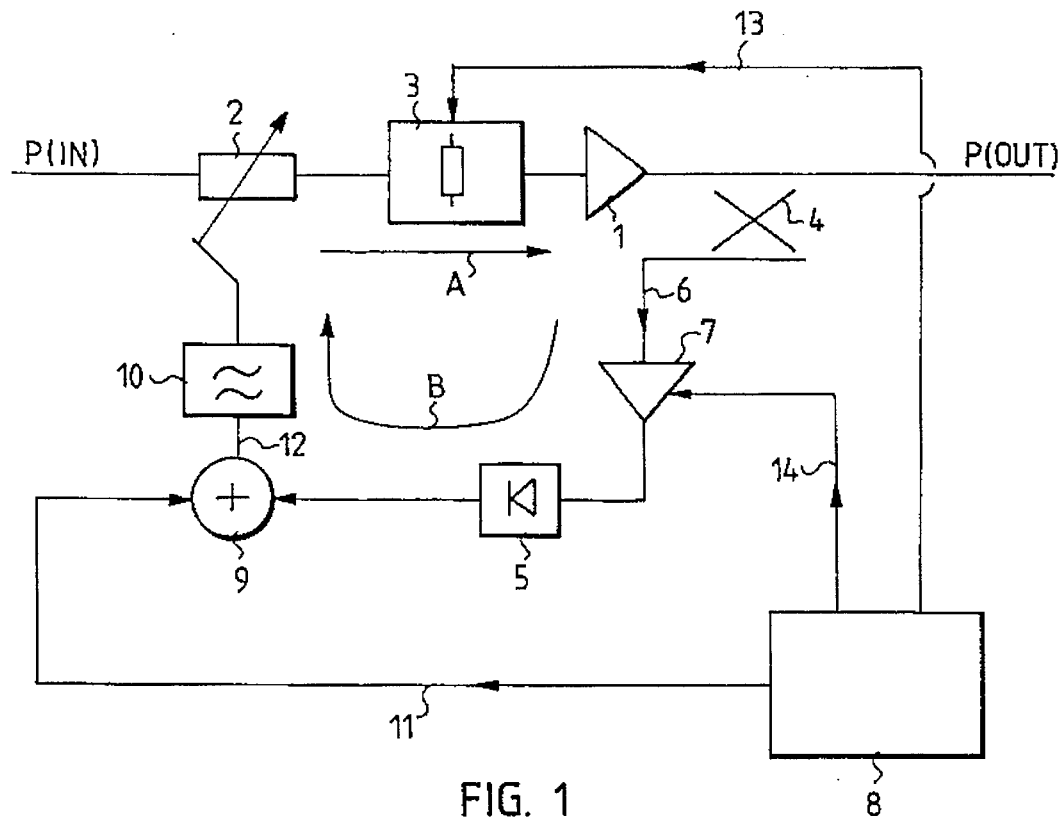
FIG. 1 shows a block diagram of an arrangement according to the invention.

The arrangement of FIG. 1 comprises a power control loop constituted by a forward line A and a feed-back line B. The arrangement comprises a high-frequency power amplifier 1 connected to the forward line A, a control means 2 and an attenuation means 3 connected to the input side of the high-frequency power amplifier 1. The control means 2 may be realized by means of a volt age-controlled attenuator (VCA), for instance, and the attenuation means 3 may in turn be realized for example by means of switches and resistances in such a way that either an attenuation of 40 dB or a very small attenuation is achieved by the attenuation means. Indication P(IN) represents the input side, to which a signal to be amplified comes from a modulator of a transmitter and indication P(OUT) represents an antenna line starting from the output side of the amplifier. In addition, the arrangement comprises a sampling means 4 and a detector means 5 connected to the feedback line B between the output side and the input side of the amplifier. The sampling means 4 may preferably be constituted by a directional coupler, such as a microstrip directional coupler, by which from an output signal of the amplifier is generated a sample signal 6 proportional to the strength of the output signal. The sample signal 6 is detected by the detector means 5, which may be constituted by a rectifier implemented by means of diodes, for instance.

To the feedback line B on the input side of the detector 5 is connected an amplifying means 7, the gain of which is of the same order of magnitude, preferably very exactly the same, as the attenuation of the attenuation means 3 on the input side of the high-frequency power amplifier 1. The preferred embodiment of FIG. 1 shows that the attenuation means 3 not breaking the signal path is connected between the control means 2 and the high-frequency power amplifier 1 and that the amplifying means 7 of the feedback line B is connected between the directional coupler acting as the sampling means 4 and the detector means 5. Referring further to FIG. 1, the arrangement also comprises a control unit 8, a summer 9 and a low-pass filter 10.

The attenuation means 3 not breaking the signal path may be connected alternatively in front of the control means 2, in which case the control means 2 and the attenuation means 3 would thus be in opposite order in FIG. 1.

The method for controlling the operation of a high-frequency power amplifier comprises inputting a signal to be amplified to a high-frequency power amplifier 1 in a forward line A, generating a sample signal from the forward line A on the output side of the high-frequency power amplifier 1 to a feedback line B by means of a sampling means 4. The method further comprises detecting the sample signal by a detector means 5, summing the detected sample signal to a reference signal 11 to be obtained from a control unit or actuating means 8, low-pass filtering the summation signal 12 by a low-pass filter 10 and gain, if necessary. The method also comprises controlling the gain of the high-frequency power amplifier 1 on the basis of the detected, summed and filtered sample signal by a control means 2 connected to the input side of the high-frequency power amplifier. When the power is switched off, the method also comprises bringing the high-frequency power amplifier 1 to an OFF state controlled by control signals 13 and 14, which control signals 13 and 14 are generated in the control unit 8. The high-frequency power amplifier is brought to the OFF state, without breaking the signal path, by attenuating the signal to be inputted to the input side of the high-frequency power amplifier 1 by an attenuation means 3 with a desired attenuation and by amplifying the signal of the feedback line B with a desired gain and preferably expressly as much as the signal of the input side was attenuated. In this case, the attenuation to which the forward line A of the input side of the high-frequency power amplifier 1 shall be exposed is substantially equal to the gain to which the feedback line shall be exposed, thanks to which the detector means 5 omits to react to switching off the power better and better and is thus capable of avoiding control errors.

The voltage-controlled control means 2 performs an attenuation of 40 dB and the attenuation means 3 performs another attenuation of still 40 dB, thanks to which the signal to be connected is attenuated by 80 dB, which is enough. In order not to exceed the dynamic range of the detector 5, a signal passing simultaneously to the detector 5 in the feedback line is amplified with 40 dB by an amplifying means 7, i.e. an amplifier serving said feedback line. As the amplifying means 7 of the feedback line is used a switched gain amplifier with a gain of 40 dB, for instance. The amplifying means 7 is active only in an OFF state of power switching when the power of the high-frequency amplifier itself is switched off. Correspondingly, as the attenuation means 3 is used a switched attenuator with an attenuation of 40 dB, for instance, which attenuator is active only in an OFF state when the power of the high-frequency power amplifier itself is switched off. In a preferred embodiment, the attenuation of the forward line A and the gain of the feedback line B are switched on by the common control unit 8 according to FIG. 1, and expressly by the same control unit 8 by which the reference signal 11 is inputted to the summer 12, making a solution possible which is structurally the simplest and the easiest to implement. The control unit 8 constitutes an external control means 8 with respect to the loop, by which means RF attenuation and RF gain are controlled.

In a preferred embodiment, separate detector means are used for detecting separate power ranges. These separate detector means have sensitivities deviating from each other, the first detector means being used for detecting an OFF state and the second detector means being used for detecting an ON state. The sensitivities are selected in such a way that the detector means which is active in an OFF state, i.e. when power is switched off, is more sensitive.

Figure 2:
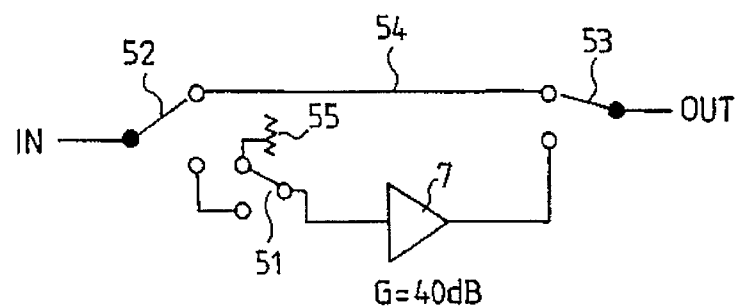
FIG. 2 shows an embodiment of the position of an amplifying means of a feedback line.

FIG. 2 shows an embodiment of the position of the amplifying means 7 of the feedback line. In FIG. 2, the input side IN is connected to the sampling means 4 of FIG. 1 and the output side OUT is connected to the detector 5 of FIG. 1. In the embodiment of FIG. 2, the arrangement comprises a first switching means 51 connected in series with the amplifying means 7 of the feedback line, and the arrangement comprises further a second and a third switching means 52 and 53 and a conductor means 54 between them. The second and the third switching means 52 and 53 can be connected in series either with the conductor means 54 or with the first switching means 51 and the amplifying means. The switching means 51 to 53 are arranged under common control, the upper position of FIG. 2 showing a normal situation with no gain supplied to the feedback line. In a situation with the switches 51 to 53 in the lower position, a gain of about 40 dB is supplied to the feedback line, i.e. as much as the forward signal is attenuated by the attenuation means 3 of FIG. 1. As far as choice of components is concerned, the solution of FIG. 2 is a preferred embodiment, since switching means at fair cost are used therein. The typical attenuation capacity of the switching means of SPDT type shown in FIG. 2 is about 30 dB at GSM frequencies.

In FIG. 2, with the switch 51 in open position, i.e. in the upper position, the amplifier is connected to a terminal 55, which may be implemented by means of a resistance, for instance. The advantage is then achieved that the input of the amplifier 7 does not remain open when the switch 51 is open. Accordingly, the amplifying means 7 is on its input side connectable to the input IN via the switches 51 and 52 when they are in the lower position, or alternatively, the amplifying means 7 is connectable via the switch 51 to the terminal, in this case to the resistance 55, when the switches 51 and 52 are in the upper position.

The solution according to FIG. 2 is presented only as an example, i.e. as one preferred embodiment, and it is clear that the solution of FIG. 2 also has several alternative embodiments, such as the one in which the two signal paths between the input and output shown in FIG. 2 may comprise a separate directional coupler and/or a detector means.

In one preferred embodiment, different amplification values are provided by changing the sample signal 6 to be taken from the output side of the high-frequency power amplifier 1 and coming to the amplifying means 7. This is preferably made possible by means of at least two separate directional couplers contained in the input side of the amplifying means 7, or by a corresponding means, the output signals of which deviate from each other.

Though the invention has been described above with reference to the examples according to the attached drawings, it is clear that the invention is not restricted to them, but it can be modified in many ways within the scope of the inventive idea set forth in the attached claims.

I claim:

1. A method for controlling the operation of a high-frequency power amplifier, comprising the steps of:
   (a) inputting a signal to be amplified, to an input side of a high-frequency power amplifier, in a forward line providing a signal path;
   (b) generating a sample signal from the forward line, on an output side of said high-frequency power amplifier, to a feedback line as a signal of the feedback line;
   (c) controlling the high-frequency power amplifier via said feedback line on the basis of said sample signal, by a control connected to the input side of the high-frequency power amplifier; and
   (d) bringing the power amplifier to an OFF state control signals without breaking the signal path, by:
      (i) operating an attenuator for attenuating the signal being inputted to the input side of the high-frequency power amplifier by a desired attenuation, and
      (ii) operating a feedback line amplifier for amplifying the signal of the feedback line by a desired gain.

2. The method of claim 1, wherein:
   the attenuation and gain provided in step (d) are substantially equal in magnitude.

3. The method of claim 1, wherein:
   step (d) includes providing said control signals to said attenuator and to said feedback line amplifier by a control unit serving both said attenuator and said feedback line amplifier in common.

4. The method of claim 1, wherein:
   step (d)(i) includes causing the feedback line amplifier to provide different amplification values by changing said sample signal of said feedback line as inputted to said feedback line amplifier.

5. An arrangement for controlling a high-frequency power amplifier, comprising:
   a high-frequency power amplifier having an input side and output side, said high-frequency power amplifier being connected in a forward line and providing with said forward line a signal path;
   a control means connected to the input side of the high-frequency power amplifier;
   an attenuation means connected to the input side of the high-frequency power amplifier for providing an attenuation, without breaking said signal path, when actuated;
   a feedback line serving said control means;
   a sampling means connected to said feedback line and arranged to provide a signal for said feedback line which is proportional to signaling carried by said forward line on the output side of said high-frequency power amplifier;
   a detector means having an input side and an output side and being connected to said feedback line for detecting signalling carried by said feedback line between said sampling means and said control means;
   a feedback line amplifier connected to said feedback line between the input side of said detector means, for providing a gain, when actuated which is of the same order of magnitude as said attenuation; and
   means for actuating said attenuation means and said feedback line amplifier so as to respectively provide the respective attenuation and gain at a same time.

6. The arrangement according to claim 5, wherein:
   said attenuation means is effectively connected to said forward line between said control means and said high-frequency power amplifier;
   said sampling means comprises a directional coupler; and
   said feedback line amplifier is effectively connected to said feedback line between said directional coupler and said detector means.

7. The arrangement according to claim 5, wherein:
   said control means is effectively connected to said forward line between said attenuating means and said high-frequency power amplifier;
   said sampling means comprises a directional coupler; and
   said feedback line amplifier is effectively connected to said feedback line between said directional coupler and said detector means.

8. The arrangement according to claim 5, further comprising:
   a first switching means connected in series with said feedback line amplifier to said feedback line;
   a second switching means;
   a third switching means;
   a conductor connecting said second and third switching means;
   said second and third switching means being switchable between being connected in series either with said conductor means, or with said first switching means and said feedback line amplifier.

9. The arrangement according to claim 8, further comprising:
   a terminal;
   said feedback line amplifier, arranged to be switched off at an input side thereof by said first switching means and connected to said terminal.

10. The arrangement of claim 9, wherein:
    said terminal comprises a resistance.

* * * * *

UNITED STATES PATENT AND TRADEMARK OFFICE
CERTIFICATE OF CORRECTION

PATENT NO. : 5,585,762
DATED : December 17, 1996
INVENTOR(S) : Dekker

It is certified that error appears in the above-indentified patent and that said Letters Patent is hereby corrected as shown below:

On the title page, at item [30], correct the filing date of the Finnish patent application to --September 6, 1993--.

Signed and Sealed this

Eighth Day of April, 1997

Attest:

BRUCE LEHMAN

Attesting Officer

Commissioner of Patents and Trademarks